United States Patent [19]
Ackland et al.

[11] Patent Number: 6,141,050
[45] Date of Patent: Oct. 31, 2000

[54] MOS IMAGE SENSOR

[75] Inventors: Bryan David Ackland, Old Bridge; David Andrew Inglis, Holmdel, both of N.J.; Marc J. Loinaz, New York, N.Y.

[73] Assignee: Lucent Technologies Inc., Murray Hill, N.J.

[21] Appl. No.: 08/879,926

[22] Filed: Jun. 20, 1997

[51] Int. Cl.$^7$ .................................................. H04N 5/335
[52] U.S. Cl. ..................... 348/308; 348/241; 250/214 R; 250/208.1
[58] Field of Search ..................................... 348/294, 297, 348/300, 302, 308, 310, 241, 243, 248; 327/314, 315; 250/214 R, 208.1; H04N 5/335

[56] References Cited

U.S. PATENT DOCUMENTS

| | | | |
|---|---|---|---|
| 5,471,515 | 11/1995 | Fossum et al. . | |
| 5,576,763 | 11/1996 | Ackland et al. . | |
| 5,742,047 | 4/1998 | Buhler et al. . | |
| 6,008,486 | 12/1999 | Stam et al. | 250/214 R |
| 6,046,444 | 4/2000 | Afghahi | 348/308 |

FOREIGN PATENT DOCUMENTS

| | | |
|---|---|---|
| 0 757 390 A2 | 7/1996 | European Pat. Off. . |
| 05207376 | 8/1993 | Japan . |

OTHER PUBLICATIONS

Mikio Kyomasu, "A New MOS Imager Using Photodiode as Current Source", IEEE Journal of Solid–State Circuits, vol. 26, No. 8, Aug. 26, 1991, p. 1116–1122.

European Search Report 98304523.8–2203.

Noise in Buried Channel Charge–Coupled Devices, Robert W. Brodersen and Stephen P. Emmons, IEEE Journal of Sold–State Circuits, vol. SC–11, No. 1, Feb. 1976, pp. 147–155.

Active Pixel Sensors: Are CCD's Dinosaurs?, Eric R. Fossum, Jet Propulsion Laboratory, California Institute of Technology, 4800 Oak Grove Drive, Pasadena, California 91109 USA, pp. 1–13, Proceedings of the SPIE, vol. 1900 Charge–Coupled Devices and Solid–State Optical Sensors III (1993).

A Random Access Photodiode Array for Intelligent Image Capture, Orly Yadid–Pecht, Ran Ginosar, Member, IEEE, and Yosi Shacham Diamand, IEEE Transactions on Electron Devices, vol. 38, No. 8, Aug. 1991, pp. 1772–1778.

TP13.5: A 256X256 CMOS Active Pixel Image Sensor with Motion Detection, Alex Dickinson, Bryan Ackland, El–Sayed Eid, David Inglis, Eric R. Fossum, 1995 IEEE International Solid–State Circuits Conference, pp. 226–227.

No Image Lag Photodiode Structure in the Interline CCD Image Sensor, Nobukazu Teranishi, Akiyoshi Kohono, Yasuo Ishihara, Eiji Oda and Kouichi Arai pp. 324–327, 1982 IEEE.

*Primary Examiner*—Tuan Ho
*Attorney, Agent, or Firm*—Eugene J. Rosenthal

[57] ABSTRACT

An image sensor circuit which employs a photodiode in conjunction with a charge transfer mechanism. By employing the photodiode, at least a portion of the light sensed does not pass through a layer of polysilicon, and so is not prevented from reaching the sensing area by the polysilicon. The image sensor circuit of the invention is made up of device structures readily available in standard CMOS process technologies Advantageously, image sensors embodying the invention show substantially improved quantum efficiency for short wavelength light over the prior art sensors. In addition, image sensors embodying the invention display improved dark current uniformity, thus improving yield.

33 Claims, 3 Drawing Sheets

MOS IMAGE SENSOR

TECHNICAL FIELD

This invention relates to CMOS active pixel sensors, and more particularly, to photodiode-based CMOS active pixel sensors.

BACKGROUND OF THE INVENTION

A well known problem in the art of photogate CMOS and CCD image sensors is that of reduced short wavelength optical response. More specifically, one photogate circuit disclosed in U.S. Pat. No. 5,576,763, issued to Ackland, et al. on Nov. 19, 1996 achieves very low read noise. As disclosed, the main photosensitive region of the photogate circuit is the depletion region under the photogate and the region that is within the minority carrier diffusion length of the edge of that depletion region. The photogate is made large in area so as to maximize the number of collected electrons. However, the photogate sensor circuit suffers from poor quantum efficiency for short wavelength light due to the absorption characteristics of the polysilicon gate material employed. This problem is aggravated by the use of silicided gates which are used in many current CMOS fabrication processes. Photogate CCD image sensors, e.g. frame transfer CCD's, also suffer from this problem.

Photodiode-based image sensors have a better short wavelength optical response properties. However, CMOS photodiode-based image sensors suffer from a problem with reset noise. Specifically, it is impractical to save the actual reset value for the sensor, which is subtracted from the sensor output to eliminate the effect of reset noise from the sensor output. Therefore, a simulated reset value for a sensing cycle is developed using the output of the sensor after it is reset for the next sensing cycle. However, such simulated reset values may not accurately represent the actual reset value for the sensing cycle in which they are used, resulting in a poorer image quality.

SUMMARY OF THE INVENTION

The problems with prior image sensors are ameliorated, in accordance with the principles of the invention, by an image sensor circuit which employs a photodiode in conjunction with a charge transfer mechanism in lieu of the prior art photogate light sensor. By employing the photodiode, at least a portion of the light sensed does not pass through a layer of polysilicon, and so is not prevented from reaching the sensing area by the polysilicon. The image sensor circuit of the invention is made up of device structures readily available in standard CMOS process technologies Advantageously, image sensors embodying the invention show substantially improved quantum efficiency for short wavelength light over the prior art sensors. In addition, image sensors embodying the invention display improved dark current uniformity, thus improving yield. Further advantageously, image sensors of the present invention have lower reset noise than prior art CMOS photodiode image sensors.

DETAILED DESCRIPTION

Figure 1:
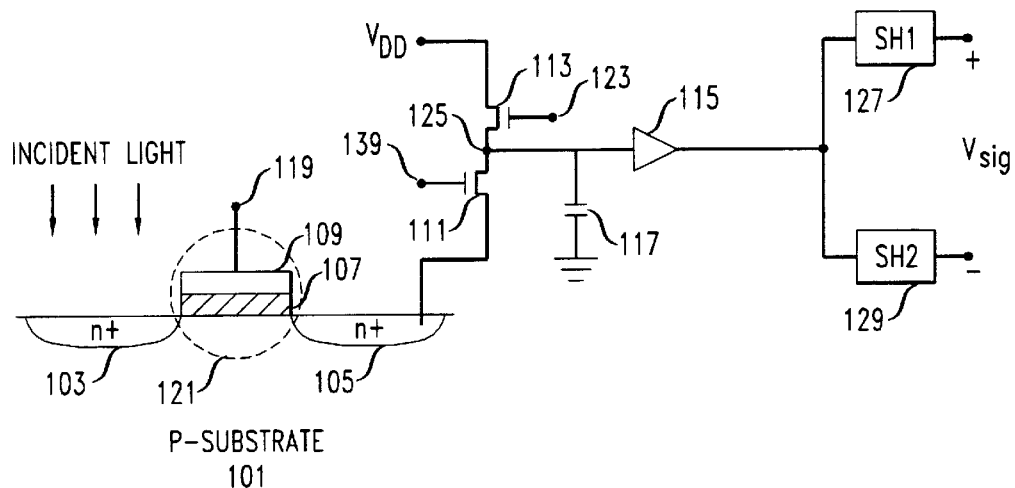
FIG. 1 shows an exemplary embodiment of an image sensor circuit which employs a photodiode in conjunction with a charge transfer mechanism and is compatible with CMOS manufacturing processes, in accordance with the principles of the invention.
Figure 2:
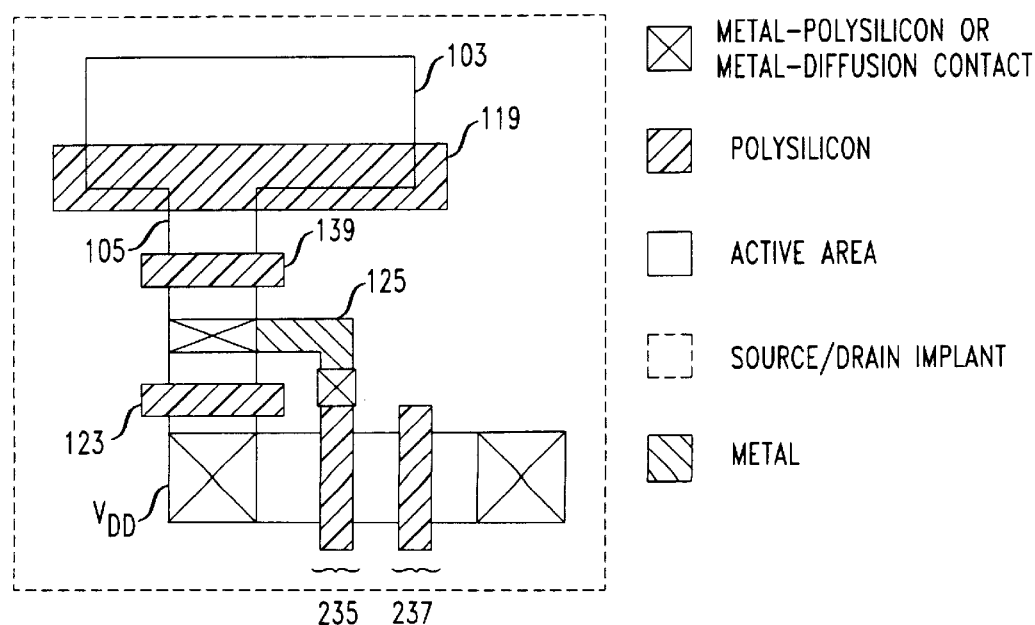
FIGS. 2–5 show various possible arrangements for laying out the sensor on a silicon integrated circuit.

FIG. 1 shows an exemplary embodiment of an image sensor circuit which employs a photodiode in conjunction with a charge transfer mechanism and is compatible with CMOS manufacturing processes, in accordance with the principles of the invention.

The image sensor circuit shown in FIG. 1 includes p-substrate 101, n+ regions 103 and 105, silicon dioxide (SiO2) layer 107, polysilicon layer 109, transistors 111 and 113, amplifier 1 15, and parasitic capacitor 117. The boundary of n+ region 105 with p-substrate 101 forms photodiode D1 while the boundary of n+ region 103 with p-substrate 101 forms photodiode D2. Polysilicon layer 109, SiO2 layer 107, and p-substrate 101 form a gate, which need not be a photogate, of NMOS transistor 121 which is formed by n+ region 103, n+ region 105, p-substrate 101, SiO2 layer 107, and polysilicon layer 109.

Operation of the circuit shown in FIG. 1 is as follows. The light to be sensed falls on photodiodes D1 or D2. In such photodiodes, the photosensitive regions comprise the depletion region and the region that is within one minority carrier diffusion length of the edge of that depletion region. D2, along with D1, form photosensitive regions that have high quantum efficiency in the short wavelength region of the visible spectrum.

Gate terminal 119 of transistor 121 is held high, allowing incident light to produce electron-hole pairs in the depletion region underneath photodiodes D1 and D2 and gate SiO2 layer 107. The generated electrons are collected and stored underneath the gate for a period of time, e.g., 30 milliseconds. During this time, electrons from n+ region 103 will occupy most of the interface states in the interface formed by p-substrate 101 and SiO2 layer 107 underneath the gate of transistor 121. This results in a reduced thermal carrier generation and hence reduced dark current. Furthermore, the reduced dark current results in a higher pixel yield.

At the end of the collection time period, in order to read out the sensor, terminal 123 of transistor 113 is pulsed high momentarily, in order to reset the voltage at node 125. The reset value seen at the output of amplifier 115 is stored by sample-and-hold circuit 127. Gate terminal 119 of transistor 121 is then forced low momentarily, causing the charge stored under gate SiO2 layer 107 to be transferred to node 125. This occurs by operation of transistor 111 as a common gate amplifier. To this end, gate terminal 139 of transistor 111 is biased to a substantially fixed voltage, such as in the range of 0–3 volts, e.g., 1 volt.

The transferred charge is stored in parasitic capacitor 117, which converts the charge into a voltage. Parasitic capacitor 117 is small in comparison to the total capacitance of diodes D1, D2 and transistor 121. Advantageously, when the charge is transferred to parasitic capacitor, a larger voltage change is developed than if parasitic capacitor 117 had the same capacitance value as the total capacitance of diodes D1, D2 and transistor 121. This voltage "gain" reduces the effect of random noise in the readout circuits, which include amplifier 115 and all circuits subsequent to the output thereof.

The voltage developed at node 125 is then amplified by amplifier 115, and the amplified voltage is stored in a second sample-and-hold circuit 129. The difference between the outputs of sample-and-hold circuits 127 and 129, Vsig, is the output of the circuit. This output difference is an example of correlated double sampling, by which, advantageously, in this instance, a) the effects of reset noise, b) the effects of threshold voltage variations in transistor 113, c) offset variations in amplifier 115, and d) switching feedthrough in transistor 113 during the reset operation are canceled by the difference operation.

Figure 3:
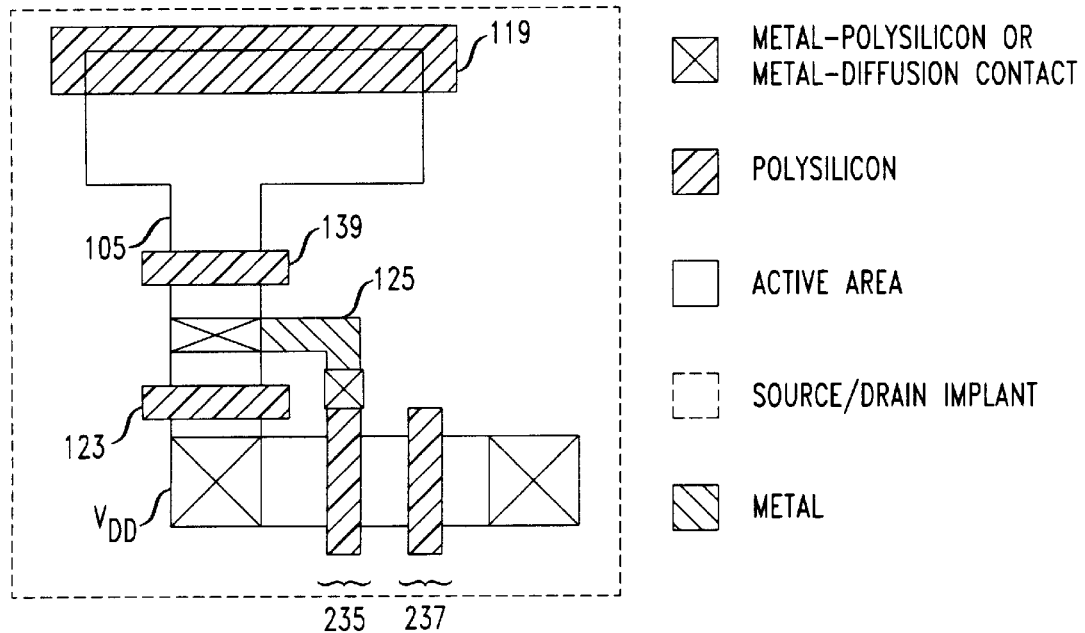
Figure 4:
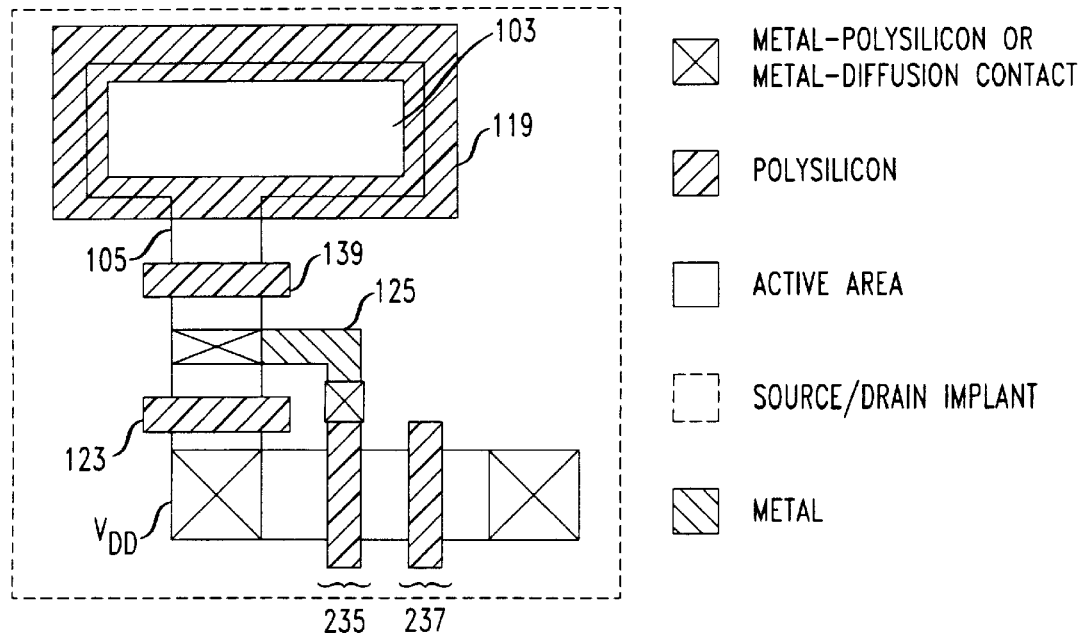
Figure 5:
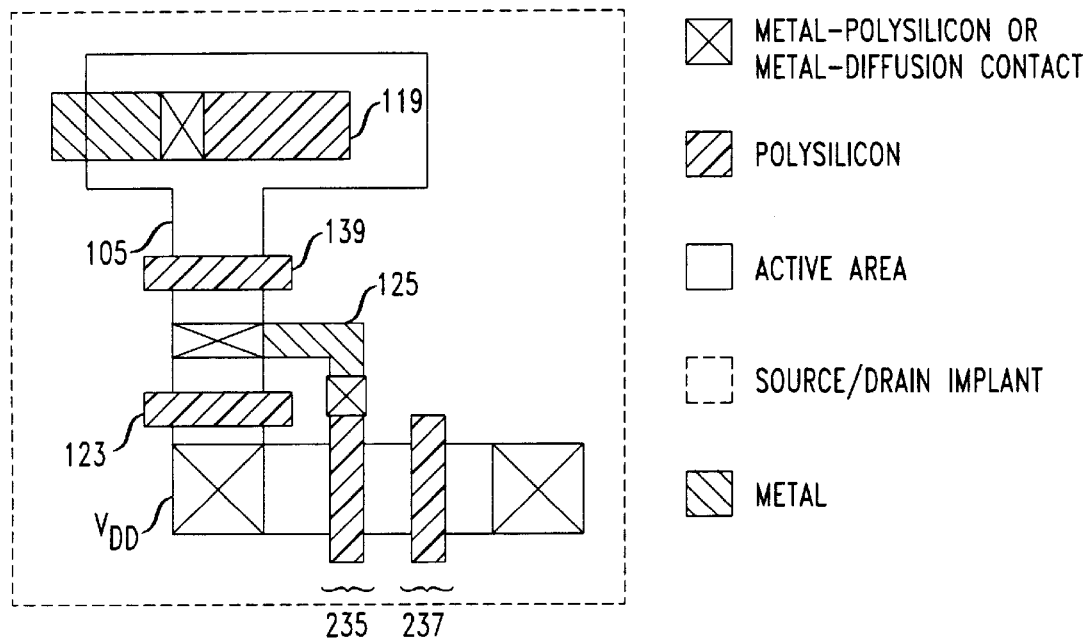

FIGS. 2–5 show various possible arrangements for laying out the sensor on a silicon integrated circuit. The legend for the various layers that implement the sensor are shown in each of the FIGS. Elements having the same number as an element in FIG. 1 correspond to the same element. In FIGS. 2–5 amplifier 115 has been implemented by transistor 235 and a selection control transistor 237 has been added to selectively address the output of the sensor. Note that n+ region 105 can be merged into n+ region 103 to form a single photodiode region, as shown in FIGS. 3 and 5.

Figure 6:
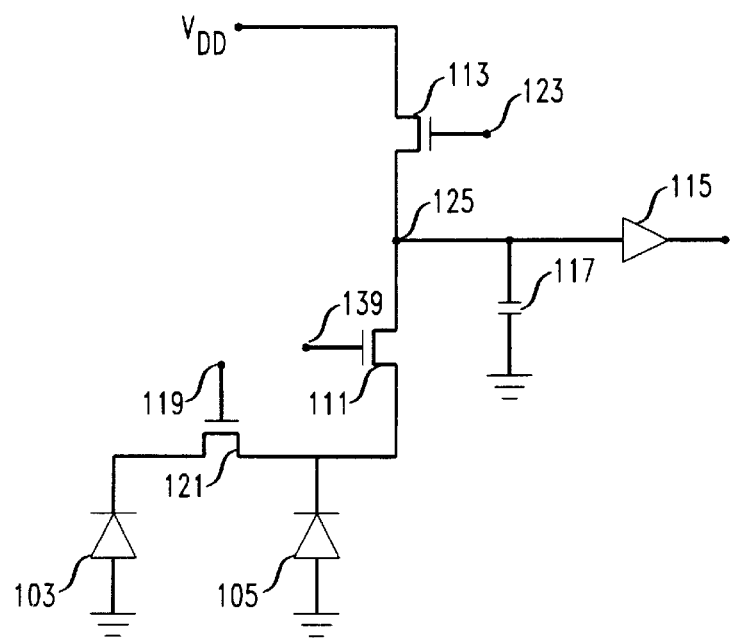
FIG. 6 shows a circuit schematic representation of the sensor

For convenience, FIG. 6 shows a circuit schematic representation of the sensor. Again, elements having the same number as an element in FIG. 1 correspond to the same element.

It is noted that amplifier 115 serves to isolate capacitor 117 from the line capacitance and the capacitance of sample and hold circuits 127 and 129.

Those of ordinary skill in the art will readily recognize how to implement the invention using PMOS transistors and/or p+ to n photodiodes. It will also be recognized that any insulating material may be used in lieu of silicon dioxide.

Note that only one photodiode need be employed. If so, the diode employed will be D1 formed by the junction of n+ region 105 (FIG. 1) and p-substrate 101. If such a circuit is employed, transistor 121 although seeming to lack a source, because of the absence of n+ region 103, can still be thought of as a transistor with its drain and source short circuited. In any event, the charge collection and transfer operation will be the same as described above.

Although transistor 113 has been shown as an NMOS transistor, it will be recognized that a PMOS transistor can give an improved reset, as it can pull the voltage at the drain of the transistor higher than a corresponding NMOS transistor can pull its source.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. An image sensor circuit, comprising:
   a first photodiode, having first and second terminals;
   a first metal oxide semiconductor (MOS) transistor, a drain of said MOS transistor being coupled to said first terminal of said first photodiode for collecting charge developed by light falling on said first photodiode;
   a second MOS transistor, a source of said second MOS transistor being coupled to said first terminal of said first photodiode and to said drain of said first MOS transistor;
   a capacitor, one terminal of said capacitor being coupled to a drain of said second transistor;
   a third MOS transistor, said source of said third MOS transistor being coupled to said drain of said second transistor;
   wherein said charge collected in said first MOS transistor is transferred through said second MOS transistor and converted into a voltage by said capacitor.

2. The invention as defined in claim 1 wherein charge transference occurs when a signal is applied to a gate of said first MOS transistor so as to turn said first MOS transistor off.

3. The invention as defined in claim 1 wherein charge transference occurs when a signal is applied to a gate of said first MOS transistor is driven so as to substantially eliminate its inversion layer.

4. The invention as defined in claim 1 wherein said second MOS transistor is configured as a common gate transistor.

5. The invention as defined in claim 1 wherein said sensor is reset by applying a signal to turn said third MOS transistor on.

6. The invention as defined in claim 1 wherein said circuit is manufactured on a p-substrate and said first terminal of said first photodiode is a cathode of said first photodiode.

7. The invention as defined in claim 1 wherein said circuit is manufactured on an n-substrate and said first terminal of said first photodiode is an anode of said first photodiode.

8. The invention as defined in claim 1 wherein said third MOS transistor is a PMOS transistor and wherein said connections of said drain and said source of said third MOS transistor are reversed.

9. The invention as defined in claim 1 further including a second photodiode having a first of its terminals coupled to a source of said first MOS transistor and wherein said first MOS transistor also collects charge developed by light falling on said second photodiode.

10. The invention as defined in claim 9 wherein said circuit is manufactured on a p-substrate and said first terminal of said second photodiode is a cathode of said second photodiode.

11. The invention as defined in claim 9 wherein said circuit is manufactured on an n-substrate and said first terminal of said second photodiode is an anode of said second photodiode.

12. The invention as defined in claim 1 wherein said capacitor is coupled to an amplifier.

13. The invention as defined in claim 12 wherein said amplifier is coupled to a sample-and-hold circuit.

14. The invention as defined in claim 12 wherein said amplifier is coupled to at least two sample-and-hold circuits.

15. The invention as defined in claim 14 wherein said third MOS transistor is turned on and a representation of a first output is stored in a first of said at least two sample-and-hold circuits while said first MOS transistor is enabled to turn on by a signal applied to a gate of said first MOS transistor.

16. The invention as defined in claim 14 wherein said third MOS transistor is turned off and a representation of a second output is stored in a second of said at least two sample-and-hold circuits while said first MOS transistor is turned off by a signal applied to a gate of said first MOS transistor.

17. The invention as defined in claim 14 wherein said third MOS transistor is turned off and a representation of a second output is stored in a second of said at least two sample-and-hold circuits after said first MOS transistor is turned off by a signal applied to a gate of said first MOS transistor.

18. The invention as defined in claim 14 wherein said third MOS transistor is turned on and a representation of said first output is stored in a first of said at least two sample-and-hold circuits while said first MOS transistor is enabled to turned on by a signal applied to a gate of said first MOS transistor and thereafter said third MOS transistor is turned off and a representation of said second output is stored in a second of said at least two sample-and-hold circuits after said charge accumulated by said first MOS transistor is transferred to said capacitor by a signal applied to a gate of said first MOS transistor.

19. The invention as defined in claim 18 further including means for determining a difference between said representation of said first output is stored in said first of said at least two sample-and-hold circuits and said representation of said second output is stored in said second of said at least two sample-and-hold circuits.

20. An image sensor circuit, comprising:
   a p-substrate having formed therein at least one n+ region, a junction between said p-substrate and said n+ region forming a first photodiode;
   an insulator layer between said p-substrate layer and a layer of polysilicon to form a first NMOS transistor, a cathode of said at least one photodiode being coupled to a drain of said NMOS transistor, said first NMOS transistor being for collecting charge developed by light falling on said first photodiode;
   a second NMOS transistor, a source of said second NMOS transistor being coupled to said first terminal of said first photodiode and to said drain of said first NMOS transistor;
   a capacitor, one terminal of said capacitor being coupled to a drain of said second transistor;
   a third MOS transistor, said source of said third MOS transistor being coupled to said drain of said second NMOS transistor;
   wherein said charge collected in said first NMOS transistor is transferred through said second NMOS transistor and converted into a voltage by said capacitor.

21. The invention as defined in 20 wherein said third MOS transistor is a NMOS transistor.

22. The invention as defined in 20 wherein said third MOS transistor is a PMOS transistor.

23. The invention as defined in 20 further including at least a second n+ region, a junction between said p-substrate and said second n+ region forming a second photodiode, a cathode of said second photodiode being coupled to a source of said first NMOS transistor wherein said first NMOS transistor also collects charge developed by light falling on said second photodiode.

20. The invention as defined in claim 20 wherein said insulator layer is an oxide layer.

25. The invention as defined in claim 24 wherein said insulator layer includes silicon dioxide.

26. An image sensor circuit, comprising:
   a n-substrate having formed therein at least one p+ region, a junction between said n-substrate and said p+ region forming a first photodiode;
   an insulator layer between said n-substrate layer and a layer of polysilicon to form a first PMOS transistor, an anode of said photodiode being coupled to a drain of said PMOS transistor;
   a second PMOS transistor, a source of said second PMOS transistor being coupled to said first terminal of said first photodiode and to said drain of said first PMOS transistor;
   a capacitor, one terminal of said capacitor being coupled to a drain of said second transistor;
   a third MOS transistor, said source of said third MOS transistor being coupled to said drain of said second PMOS transistor;
   wherein said charge collected in said first PMOS transistor is transferred through said second PMOS transistor and converted into a voltage by said capacitor.

27. The invention as defined in claim 26 wherein said third MOS transistor is an PMOS transistor.

28. The invention as defined in claim 26 wherein said third MOS transistor is an NMOS transistor.

29. The invention as defined in claim 26 further including at least a second p+ region, a junction between said n-substrate and said second p+ region forming a second photodiode, an anode of said second photodiode being coupled to a source of said first PMOS transistor wherein said first PMOS transistor also collects charge developed by light falling on said second photodiode.

30. The invention as defined in claim 26 wherein said insulator layer is an oxide layer.

31. The invention as defined in claim 26 wherein said insulator layer includes silicon dioxide.

32. A method for operating an image sensor circuit, said image sensor including
   a first photodiode, having first and second terminals;
   a first metal oxide semiconductor (MOS) transistor, a drain of said MOS transistor being coupled to said first terminal of said first photodiode for collecting charge developed by light falling on said first photodiode;
   a second MOS transistor in a common gate configuration, a source of said second MOS transistor being coupled to said first terminal of said first photodiode and to said drain of said first MOS transistor;
   a capacitor, one terminal of said capacitor being coupled to a drain of said second transistor;
   a third MOS transistor, said source of said third MOS transistor being coupled to said drain of said second transistor;
   the method comprising the steps of:
   collecting electrons developed by light falling on said first photodiode;
   setting the value of a voltage across said capacitor to a first value;
   storing a representation of said first value;
   transferring said collected electrons to said capacitor; and
   storing a representation of the value of a second voltage across said capacitor after said transferring step.

33. The invention as defined in claim 32 further including the step of developing a difference between said stored representation of said first value and said stored representation of the value of a second voltage across said capacitor after said transferring step.

* * * * *